(12) United States Patent
Okawara et al.

(10) Patent No.: US 9,620,632 B2
(45) Date of Patent: Apr. 11, 2017

(54) SEMICONDUCTOR DEVICE AND METHOD OF MANUFACTURING THE SEMICONDUCTOR DEVICE

(71) Applicant: TOYOTA JIDOSHA KABUSHIKI KAISHA, Toyota-shi, Aichi-ken (JP)

(72) Inventors: Jun Okawara, Nisshin (JP); Yusuke Yamashita, Nagoya (JP); Satoru Machida, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/030,192

(22) PCT Filed: Oct. 30, 2014

(86) PCT No.: PCT/IB2014/002271
§ 371 (c)(1),
(2) Date: Apr. 18, 2016

(87) PCT Pub. No.: WO2015/068008
PCT Pub. Date: May 14, 2015

(65) Prior Publication Data
US 2016/0240641 A1 Aug. 18, 2016

(30) Foreign Application Priority Data
Nov. 6, 2013 (JP) ................................ 2013-230092

(51) Int. Cl.
*H01L 29/36* (2006.01)
*H01L 29/06* (2006.01)
(Continued)

(52) U.S. Cl.
CPC ...... *H01L 29/7397* (2013.01); *H01L 29/0619* (2013.01); *H01L 29/08* (2013.01);
(Continued)

(58) Field of Classification Search
CPC ............. H01L 27/0664; H01L 29/0878; H01L 29/1095; H01L 29/36; H01L 29/66348; H01L 29/7397
See application file for complete search history.

(56) References Cited

U.S. PATENT DOCUMENTS 6,774,434 B2 * 8/2004 Hueting .............. H01L 29/0653
257/152
2011/0248286 A1 10/2011 Onose
(Continued)

FOREIGN PATENT DOCUMENTS

EP 0756330 A2 1/1997
JP 2010-050307 A 3/2010
(Continued)

*Primary Examiner* — Raj R Gupta
(74) *Attorney, Agent, or Firm* — Oliff PLC

(57) ABSTRACT

A semiconductor device includes: a semiconductor substrate, an upper electrode, a lower electrode and a gate electrode. In the semiconductor substrate, a body region, a pillar region, and a barrier region are formed. The pillar region has an n-type impurity, is formed on a lateral side of the body region, and extends along a depth from a top surface of the semiconductor substrate to a lower end of the body region. The barrier region has an n-type impurity and is formed on a lower side of the body region and the pillar region. The barrier region is formed on the lower side of the pillar region. An n-type impurity concentration distribution in a depth direction in the pillar region and the barrier region has a maximum value in the pillar region. The n-type impurity concentration distribution has a folding point on a side deeper than the maximum value.

4 Claims, 5 Drawing Sheets

(51) Int. Cl.
*H01L 27/06* (2006.01)
*H01L 29/739* (2006.01)
*H01L 29/861* (2006.01)
*H01L 29/872* (2006.01)
*H01L 29/08* (2006.01)
*H01L 29/10* (2006.01)
*H01L 29/66* (2006.01)
*H01L 29/417* (2006.01)

(52) U.S. Cl.
CPC ...... *H01L 29/0804* (2013.01); *H01L 29/0821* (2013.01); *H01L 29/1095* (2013.01); *H01L 29/66348* (2013.01); *H01L 29/8611* (2013.01); *H01L 29/872* (2013.01); *H01L 29/0692* (2013.01); *H01L 29/41766* (2013.01)

(56) References Cited

U.S. PATENT DOCUMENTS

| | | | |
|---|---|---|---|
| 2011/0291157 A1* | 12/2011 | Takahashi | H01L 29/0696 257/144 |
| 2012/0032313 A1 | 2/2012 | Yamamoto et al. | |
| 2012/0043581 A1* | 2/2012 | Koyama | H01L 29/0696 257/140 |
| 2014/0048847 A1 | 2/2014 | Yamashita et al. | |

FOREIGN PATENT DOCUMENTS

| | | |
|---|---|---|
| JP | 2011-222681 A | 11/2011 |
| JP | 2012-054532 A | 3/2012 |
| JP | 2013-048230 A | 3/2013 |
| JP | 2013051345 A | 3/2013 |
| WO | 2013/014943 A2 | 1/2013 |

* cited by examiner

SEMICONDUCTOR DEVICE AND METHOD OF MANUFACTURING THE SEMICONDUCTOR DEVICE

BACKGROUND OF THE INVENTION

1. Field of the Invention

A technology that the present specification discloses relates to a semiconductor device and a method of manufacturing the semiconductor device.

2. Description of Related Art

Japanese Patent Application Publication No 201348230 (JP2013-48230 A) discloses a semiconductor device in which an IGBT and a diode are formed. The IGBT of the semiconductor device includes a barrier region and a pillar region. The barrier region is an n-type region having a high n-type impurity concentration and is formed on the lower side of a body region. The pillar region extends from a top surface of a semiconductor substrate to the barrier region. In the semiconductor device, the body region (p-type) of the IGBT and the barrier region (n-type) of the IGBT form a pn-junction. The pn-junction is made difficult to be turned on by the pillar region. That is, since the barrier region is connected to an upper electrode via the pillar region, a potential of the barrier region is a potential close to a potential of the upper electrode. Even when a voltage by which the upper electrode becomes a higher potential than a lower electrode is applied to the semiconductor device, a high voltage is not applied to the pn-junction described above. Therefore, it is difficult to supply holes from the body region to a drift region. Therefore, in the semiconductor device, a main current flows not through the pn-junction described above but through the pillar region and the barrier region. Thereafter, when an applied voltage is switched to a reverse direction, since the holes in the drift region are discharged to the upper electrode, a current (a backward current with respect to the pn-junction described above) instantaneously flows to the semiconductor device. However, in the semiconductor device, since it is difficult to supply the holes to the drift region, the holes to be discharged to the upper electrode when the applied voltage is switched are scarce, and a backward current is small. Thus, the semiconductor device is excellent in the reverse recovery characteristics.

In the semiconductor device of JP 2013-48230 A, when the IGBT is turned off, a depletion layer expands from the pn-junction of the body region and the bather region to the circumference thereof. At this time, when an n-type impurity concentration in the barrier region is high, the depletion layer broadly extends in the body region. When the depletion layer broadly extends in the body region like this, resistance of the body region becomes high. When the resistance of the body region is high, since the potential of the body region is likely to be high when the IGBT is turned on, a pn-junction between the body region and an emitter region is likely to be turned on As a result, a parasitic npn transistor formed by the emitter region, the body region and the barrier region is likely to be turned on, and the IGBT is likely to cause latch-up.

SUMMARY OF THE INVENTION

In the present specification, a semiconductor device that has a barrier region and a pillar region and is less likely to cause latch-up, and a method of manufacturing the semiconductor device are provided.

A semiconductor device according to a first aspect of the present invention includes a semiconductor substrate, an upper electrode, a lower electrode, and a gate electrode. The upper electrode is formed on a top surface of the semiconductor substrate. The lower electrode is formed on a bottom surface of the semiconductor substrate. In the semiconductor substrate, an emitter region, a body region, a pillar region, a barrier region, a drift region, a collector region and a cathode region are formed. The emitter region has an n-type impurity and is connected to the upper electrode. The body region has a p-type impurity, is formed on a lateral side and on a lower side of the emitter region, and is connected to the upper electrode. The pillar region has an n-type impurity, is formed on a lateral side of the body region, extends along a depth from the top surface of the semiconductor substrate to a lower end of the body region, is connected to the upper electrode, and is separated from the emitter region by the body region. The barrier region has an n-type impurity, is formed on the lower side of the body region and the pillar region, and is separated from the emitter region by the body region. The drift region has an n-type impurity, is formed on the lower side of the barrier region, is separated from the emitter region by the barrier region, and has an n-type impurity concentration smaller than an n-type impurity concentration in the barrier region. The collector region has a p-type impurity, is formed on the lower side of the drift region, is connected to the lower electrode, and is separated from the barrier region by the drift region. The cathode region has an n-type impurity, is formed on the lower side of the drift region, is connected to the lower electrode, is separated from the barrier region by the drift region, and has an n-type impurity concentration higher than the n-type impurity concentration in the drift region. A trench that penetrates through the emitter region, the body region and the barrier region and reaches the drift region is formed on the top surface of the semiconductor substrate. An inner surface of the trench is covered with a gate insulating film. The gate electrode is disposed in the trench. An n-type impurity concentration distribution in a depth direction in the pillar region and the barrier region has a maximum value in the pillar region. Further, the n-type impurity concentration distribution has a folding point on a side deeper than the maximum value in the pillar region in the depth direction.

The above-described n-type impurity concentration distribution means a distribution obtained by eliminating noise generated during measurement of the concentration. Therefore, the above-described maximum value and the folding point do not contain the maximum value and the folding point generated by the noise. Further, the folding point means a point at which a slope of the impurity concentration distribution changes discontinuously.

In the semiconductor device, the n-type impurity concentration distribution in the depth direction in the pillar region and the barrier region has the folding point on a side deeper than the maximum value in the pillar region in the depth direction. That is, the n-type impurity concentration distribution has the folding point on a side deeper than the maximum value in the pillar region. Such a distribution can be obtained by distributing the n-type impurity to a position deeper than the pillar region in the step of implanting and diffusing the n-type impurity for forming the barrier region. When the barrier region is formed like this, since the n-type impurity diffused from the pillar region is difficult to exist in the barrier region, an n-type impurity concentration of the barrier region can be reduced. Therefore, in the semiconductor device, the IGBT is unlikely to cause latch-up.

In the semiconductor device described above, the n-type impurity concentration distribution may have the maximum value in the barrier region.

Such a distribution can be obtained by making an implantation depth in the n-type impurity implantation for forming the barrier region deeper than that in the n-type impurity implantation for forming the pillar region. According to such a structure, the n-type impurity concentration in the barrier region can be more reduced.

In the semiconductor device described above, a p-type lower body region may be formed between the barrier region and the drift region. The lower body region separates the barrier region and the drift region, is separated from the body region by the barrier region, and may be separated from the collector region and the cathode region by the drift region.

According to such a structure, a high electric field can be prevented from being applied on a corner part of the body region. Therefore, an avalanche resistance of the semiconductor device can be improved.

The semiconductor device described above may have an average value of the p-type impurity concentration in the pillar region of less than $1\times10^{15}$ atoms/cm$^3$.

According to such a structure, since the n-type impurity concentration in the pillar region can be more reduced, also the n-type impurity concentration in the barrier region can be more reduced.

A second aspect of the present invention is to provide a method of manufacturing a semiconductor device that includes a semiconductor substrate, an upper electrode, a lower electrode, and a gate electrode. The method of manufacturing includes forming a barrier region by implanting an n-type impurity in the semiconductor substrate, and forming a pillar region by implanting an n-type impurity in the semiconductor substrate. This method of manufacturing further includes making the n-type impurity distribute to a position deeper than a region in which the pillar region is formed when the barrier region is formed.

According to the method of manufacturing, the n-type impurity concentration in the barrier region can be reduced.

The method of manufacturing described above may further include making an average stop position of the n-type impurity when the barrier region is formed deeper than an average stop position of the n-type impurity when the pillar region is formed.

According to the method of manufacturing, the n-type impurity concentration in the barrier region can be more reduced.

The method of manufacturing described above may further include forming the body region by implanting a p-type impurity in the semiconductor substrate. Further, the method of manufacturing described above may include implanting the p-type impurity in the semiconductor substrate by masking at least a part of a region in which the pillar region is formed when the body region is formed.

According to the method of manufacturing, since the p-type impurity is not implanted in at least a part of the pillar region, the n-type impurity concentration in the pillar region can be reduced. Thereby, also the n-type impurity concentration in the bather region can be reduced.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
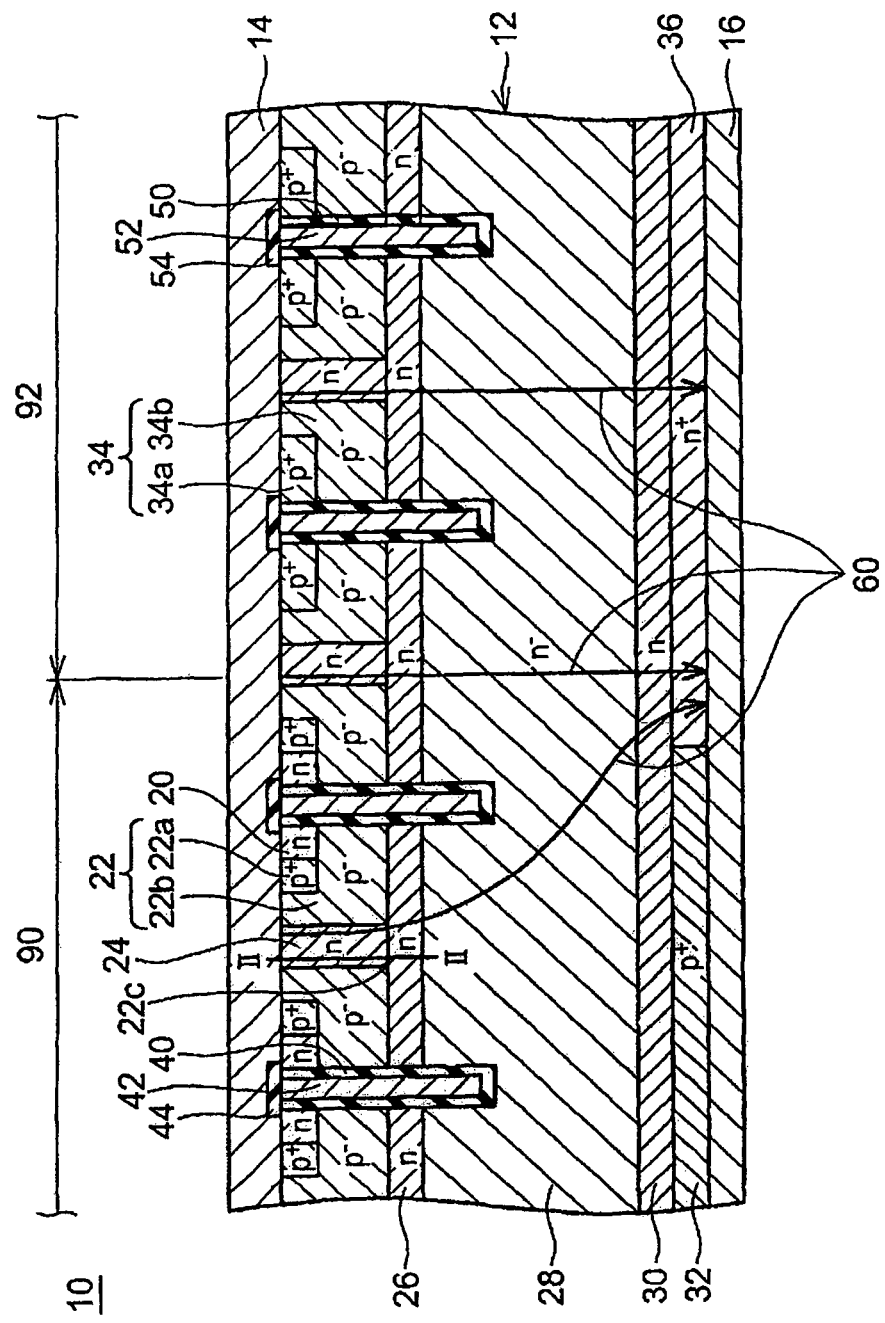
FIG. 1 is a vertical cross-sectional view of a semiconductor device 10 of Embodiment 1 of the present invention.

A semiconductor device 10 of Embodiment 1 shown in FIG. 1 includes a semiconductor substrate 12, an upper electrode 14, and a lower electrode 16. The semiconductor substrate 12 is a silicon substrate. The upper electrode 14 is formed on a top surface of the semiconductor substrate 12. The lower electrode 16 is formed on a bottom surface of the semiconductor substrate 12. The semiconductor substrate 12 includes an IGBT region 90 in which an IGBT is formed and a diode region 92 in which a diode is formed.

In the semiconductor substrate 12 in the IGBT region 90, an emitter region 20, a body region 22, a pillar region 24, a barrier region 26, a drift region 28, a buffer region 30, and a collector region 32 are formed.

The emitter region 20 has an n-type impurity and is formed in a range exposed on the top surface of the semiconductor substrate 12. The emitter region 20 forms an ohmic contact with the upper electrode 14.

The body region 22 has a p-type impurity and is formed In the range exposed on the top surface of the semiconductor substrate 12. The body region 22 includes a body contact region 22a and a low concentration body region 22b. The body contact region 22a is formed in the range exposed on the top surface of the semiconductor substrate 12. The body contact region 22a has a high p-type impurity concentration and forms an ohmic contact with the upper electrode 14. The low concentration body region 22b is formed on the lower side of the emitter region 20 and the body contact region 22a and on the lateral side of the body contact region 22a. A p-type impurity concentration in the low concentration body region 22b is lower than that in the body contact region 22a.

The pillar region 24 has an n-type impurity and is formed in the range exposed on the top surface of the semiconductor substrate 12. The pillar region 24 is in contact with the low concentration body region 22b on the lateral side of, the low concentration body region 22b. The pillar region 24 extends along a depth from the top surface of the semiconductor substrate 12 to a lower end of the body region 22. In other words, an n-type region that contacts with the body region 22 from the lateral side in a position shallower than the lower end of the body region 22 is the pillar region 24. The pillar region 24 is separated from the emitter region 20 by the body region 22. An n-type impurity concentration in the pillar region 24 is lower than that in the emitter region 20 and higher than that in the drift region 28. The pillar region 24 has the n-type impurity concentration of $1\times10^{15}$ atoms/cm³ or more and less than $1\times10^{19}$ atoms/cm³ at a position exposed on the top surface of the semiconductor substrate 12 (that is, a position that contacts with the upper electrode 14). Therefore, the pillar region 24 forms a Schottky connection with the upper electrode 14.

The barrier region 26 has an n-type impurity and is formed on the lower side of the body region 22 and the pillar region 24. The barrier region 26 is separated from the emitter region 20 by the body region 22. An n-type impurity concentration in the barrier region 26 is lower than that in the emitter region 20 and higher than that in the drift region 28. The barrier region 26 preferably has the n-type impurity concentration of $1\times10^{15}$ atoms/cm³ or more and less than $1\times10^{18}$ atoms/cm³.

The drift region 28 has an n-type impurity and is formed on the lower side of the barrier region 26. The drift region 28 is separated from the body region 22 by the barrier region 26. In the drift region 28, an n-type impurity concentration is substantially uniformly distributed. In other words, a region in which the n-type impurity concentration is substantially uniformly distributed is the drift region 28, and a region that is present on the upper side of the drift region 28 and in which the n-type impurity concentration is larger than a value of n-type impurity concentration substantially uniformly distributed is the barrier region 26.

The buffer region 30 has an n-type impurity and is formed on the lower side of the drift region 28. An n-type impurity concentration in the buffer region 30 is larger than that in the drift region 28.

The collector region 32 has a p-type impurity and is formed on the lower side of the buffer region 30. The collector region 32 is formed in the range exposed on the lower surface of the semiconductor substrate 12. The collector region 32 forms an ohmic connection with the lower electrode 16.

On the top surface of the semiconductor substrate 12 in the IGBT region 90, a plurality of trenches is formed. Each of the trenches penetrates through the emitter region 20, the low concentration body region 22b and the barrier region 26 and reaches the drift region 28. An inner surface of each of the trenches is covered with a gate insulating film 40. In each of the trenches, a gate electrode 42 is formed. The gate electrode 42 is insulated from the semiconductor substrate 12 by the gate insulating film 40. The gate electrode 42 faces the emitter region 20, the low concentration body region 22b, the barrier region 26 and the drift region 28 via the gate insulating film 40. A top surface of the gate electrode 42 is covered with an insulating film 44. The gate electrode 42 is insulated from the upper electrode 14 by the insulating film 44.

In the semiconductor substrate 12 in the diode region 92, an anode region 34, the pillar region 24, the barrier region 26, the drift region 28, the buffer region 30 and a cathode region 36 are formed.

The anode region 34 has a p-type impurity and is formed in the range exposed on the top surface of the semiconductor substrate 12. The anode region 34 includes an anode contact region 34a and a low concentration anode region 34b. The anode contact region 34a is formed in the range exposed on the top surface of the semiconductor substrate 12. The anode contact region 34a has a high p-type impurity concentration and forms an ohmic contact with the upper electrode 14. The low concentration anode region 34b is formed on the lower side and on the lateral side of the anode contact region 34a. A p-type impurity concentration in the low concentration anode region 34b is lower than that in the anode contact region 34a. The anode region 34 is formed in the range of a depth substantially the same as that of the body region 22.

On the lateral side of the low concentration anode region 34b, the above-described pillar region 24 is formed.

On the lower side of the low concentration anode region 34b and the pillar region 24 in the diode region 92, the above-described barrier region 26 is formed.

On the lower side of the barrier region 26 in the diode region 92, the above-described drift region 28 is formed. The drift region 28 continuously extends from the IGBT region 90 to the diode region 92.

On the lower side of the drift region 28 in the diode region 92, the above-described buffer region 30 is formed. The buffer region 30 continuously extends from the IGBT region 90 to the diode region 92.

On the lower side of the buffer region 30 in the diode region 92, the cathode region 36 is formed. The cathode region 36 has an n-type impurity and has the n-type impurity concentration higher than that in the buffer region 30. The cathode region 36 is formed in the range exposed on the bottom surface of the semiconductor substrate 12. The cathode region 36 forms an ohmic contact with the lower electrode 16.

On the top surface of the semiconductor substrate 12 in the diode region 92, a plurality of trenches is formed. Each of trenches penetrates through the anode region 34 and the barrier region 26 and reaches the drift region 28. An inner surface of each of the trenches is covered with an insulating film 50. A control electrode 52 is formed in each of the trenches. The control electrode 52 is insulated from the semiconductor substrate 12 by the insulating film 50. A top surface of the control electrode 52 is covered with an insulating film 54. The control electrode 52 is insulated from the upper electrode 14 by the insulating film 54.

In the IGBT region 90 and the diode region 92, a Schottky diode is formed by the upper electrode 14 and the pillar region 24 that forms, a Schottky connection with the upper electrode 14. When a voltage by which the upper electrode 14 becomes a positive side with respect to the lower electrode 16 (hereinafter, referred to as "a diode forward voltage") is input to the semiconductor device 10, the Schottky diode is turned on. That is, as shown by arrow marks 60 of FIG. 1, a current flows from the upper electrode 14 to the lower electrode 16 via the pillar region 24, the barrier region 26, the drift region 28, the buffer region 30 and the cathode region 36. Further, in the diode region 92, a pn-junction is formed from the anode region 34 and the barrier region 26. Further, in the IGBT region 90, a pn-junction is formed from the body region 22 and the barrier region 26. However, in a state where the above-described diode forward voltage is applied, these pn-junctions are difficult to be turned on, and holes are suppressed from being supplied to the drift region 28. That is, since the barrier region 26 has substantially the same potential as the pillar region 24 and the pillar region 24 forms a Schottky connection with the upper electrode 14, a potential difference between the barrier region 26 and the upper electrode 14 becomes substantially the same as a voltage drop in a Schottky interface. The voltage drop is sufficiently smaller than a built-in voltage of the above-described pn diode. Thus, the pn-junction becomes difficult to be turned on. Therefore, the holes that flow in the drift region 28 from the anode region 34 and the body region 22 are very scarce.

When a voltage applied to the semiconductor device 10 is switched from the diode forward voltage to a reversed direction thereof (a voltage by which the lower electrode 16 becomes a positive side with respect to the upper electrode 14), the diode performs a reverse recovery operation. That is, the holes present in the drift region 28 are discharged to the upper electrode 14 via the anode region 34 and the body region 22. Thus, a reverse current instantaneously flows to the diode. However, in the semiconductor device 10, as described above, in a state in which the diode forward voltage is applied, the holes supplied to the drift region 28 are scarce. Therefore, at a time when the applied voltage is switched to a reverse direction, the holes present in the drift region 28 are scarce. Therefore, at a time when the applied voltage is switched to the reverse direction, the holes that are discharged to the upper electrode 14 are scarce. Thus, in the semiconductor device 10, the current is difficult to flow during the reverse recovery operation of the diode, and the switching loss is small.

In a state in which a voltage that makes the lower electrode 16 positive with respect to the upper electrode 14 is applied to the semiconductor device 10; when a high potential (a potential higher than a gate-on potential) is applied to the gate electrode 42, the IGBT is turned on because a channel is formed in the body region 22.

In a state in which a voltage that makes the lower electrode 16 positive with respect to the upper electrode 14 is applied to the semiconductor device 10, when a low potential (a potential lower than the gate-on potential) is applied to the gate electrode 42, the IGBT is turned off because a channel is not formed in the body region 22. In this case, a depletion layer expands from a pn-junction at a boundary between the body region 22 and the bather region 26 into the drift region 28. Further, the depletion layer slightly expands from the pn-junction also into the body region 22. At this time, when the n-type impurity concentration is high in the bather region 26, the depletion layer is likely to expand into the body region 22, and resistance of the body region 22 becomes high. In the case where the resistance of the body region 22 is high, when the IGBT is turned on, the potential of the body region 22 is likely to be high. Therefore, a current is likely to flow from the body region 22 that is not channeled to the emitter region 20. Thus, when the current flows from the body region 22 that is not channeled to the emitter region 20, a parasitic npn transistor constituted by the emitter region 20, the body region 22 and the barrier region 26 is turned on. Since a current of the parasitic npn transistor becomes a base current of a parasitic pnp transistor constituted with the body region 22, the n-type regions 26 to 30 and the collector region 32, the parasitic pnp transistor is also turned on. As a result, a parasitic thyristor constituted by the parasitic npn-transistor and the parasitic pnp-transistor is turned on, and a current control becomes difficult. That is, in the IGBT region 90, so-called latch-up is generated. However, according to the semiconductor device 10 of Embodiment 1, as described below, the n-type impurity concentration in the barrier region 26 is low. Thus, the latch-up is difficult to occur.

Figure 2:
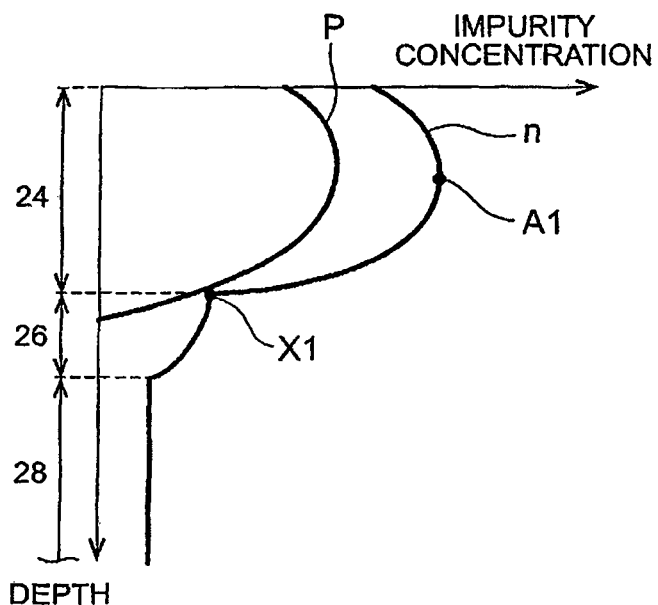
FIG. 2 is a graph that shows impurity concentration distributions in a depth direction in a pillar region 24 and a barrier region 26 on the lower side thereof.

FIG. 2 shows impurity concentration distributions along a II-II line of FIG. 1. In each of graphs that show impurity concentrations disclosed in the drawings, a vertical axis shows a depth (position) from the top surface of the semiconductor substrate 12, and a horizontal axis shows an impurity concentration in a logarithmic scale. As shown in FIG. 2, the n-type impurity concentration rises as proceeds from the top surface (a position at an upper end of FIG. 2) of the semiconductor substrate 12 to a deeper position and takes a maximum value A1 in the pillar region 24. On the lower side than the depth of the maximum value A1, the n-type impurity concentration decreases as proceeds to a deeper position while forming a mild curve. Then, in the proximity of the boundary of the pillar region 24 and the barrier region 26, a folding point X1 in which a slope of the n-type impurity concentration discontinuously changes is formed. On the lower side than the folding point X1, the n-type impurity concentration decreases as proceeds to a deeper position while forming a mild curve. In the drift region 28, the n-type impurity concentration is distributed with a low and substantially constant concentration. Further, as shown in FIG. 2, in the pillar region 24, the p-type impurity is distributed at a relatively high concentration.

Each of the semiconductor layers on the top surface side of the semiconductor device 10 is formed by impurity implantation and by impurity diffusion. Since a method of manufacturing the semiconductor device 10 of Embodiment 1 has features in the steps of forming the pillar region 24, the barrier region 26 and the low concentration body region 22*b*, these steps will be described below.

Figure 3:
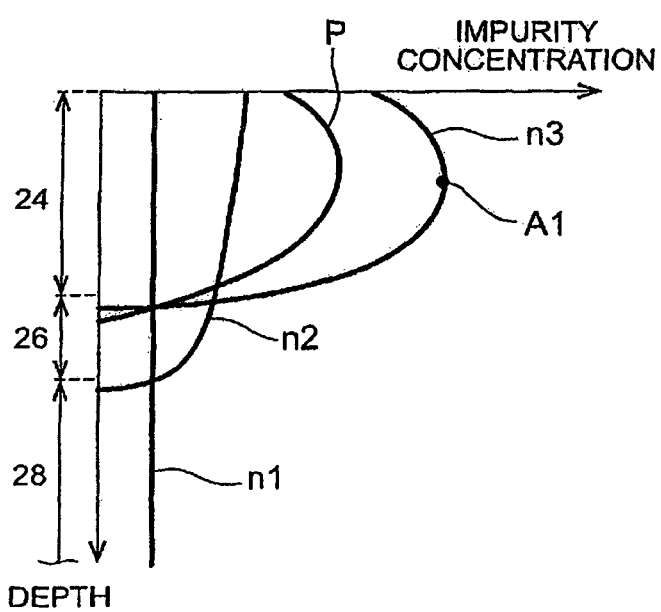
FIG. 3 is a graph that shows distributions of impurities that are implanted in the respective implantation steps in positions corresponding to FIG. 2.

Before execution of a step of implanting an impurity, the n-type impurity in the semiconductor substrate 12 has, as shown in a graph n1 of FIG. 3, a substantially uniform distribution over an entirety in the semiconductor substrate 12. The n-type impurity concentration (a concentration of graph n1) at this time is substantially the same as the n-type impurity concentration in the drift region 28 shown in FIG. 2.

In a step of forming the low concentration body region 22*b*, of the top surface of the semiconductor substrate 12, over a nearly entire region of the IGBT region 90 and the diode region 92, a p-type impurity is implanted, after that, the implanted p-type impurity is diffused. Thus, the low concentration body region 22*b* is formed. At this time, also the low concentration anode region 34*b* is simultaneously formed. Thus, since over a nearly entire region of the IGBT region 90 and the diode region 92, the p-type impurity is implanted, as shown in FIG. 3, the p-type impurity is implanted also in a region where the pillar region 24 is to be formed.

In a step of forming the barrier region 26, of the top surface of the semiconductor substrate 12, the n-type impurity is implanted over a nearly entire region of the IGBT region 90 and the diode region 92. Here, in the proximity (a very shallow position) of the top surface of the semiconductor substrate 12, the n-type impurity is implanted. Thereafter, the implanted n-type impurity is diffused. Here, a time, conditions and the like of the diffusion step are adjusted such that a diffusion distance of the n-type impurity becomes longer. Thus, as shown in a graph n2 of FIG. 3, the n-type impurity can be broadly distributed to a deep position.

In a step of forming the pillar region 24, a mask in which an opening is formed in a range corresponding to the pillar region 24 is formed on the semiconductor substrate 12. Then, the n-type impurity is implanted in the semiconductor substrate 12 through the mask. Thus, the n-type impurity is implanted only in a region in which the pillar region 24 is to be formed. Further, here, an implanting energy of the n-type impurity is controlled such that the average stop position of the n-type impurity that is implanted in the semiconductor substrate 12 may be a depth of the maximum value A1 of FIGS. 2 and 3 (that is, such that the maximum value A1 may be located in the pillar region 24). When the n-type impurity is implanted, the implanted n-type impurity is diffused, and the n-type impurity is distributed as shown in a graph n3 of FIG. 3.

The step of forming the low concentration body region 22b, the step of forming the barrier region 26 and the step of forming the pillar region 24, which are described above may be performed in any order.

When the impurity is implanted and diffused as described above, as shown in FIG. 2, the impurity concentration distribution that has the maximum value A1 and the folding point X1 can be obtained. The graph n2 of FIG. 3 broadly extends to a side lower than the graph n3. Thus, by a part where the graph n2 expands to a lower side than the graph n3, the barrier region 26 is formed.

. According to the method described above, on a lower side than a region (a region of the graph n3 of FIG. 3) in which the n-type impurity that is implanted in the pillar region 24 is distributed, the n-type impurity that is implanted in the barrier region 26 is distributed (the graph n2 of FIG. 3). In other words, the n-type impurity, that is implanted in the step of forming the pillar region 24 is not so much distributed in the barrier region 26. Therefore, the n-type impurity concentration in the barrier region 26 is low. Therefore, the semiconductor device 10 is unlikely to cause the latch-up.

Figure 4:
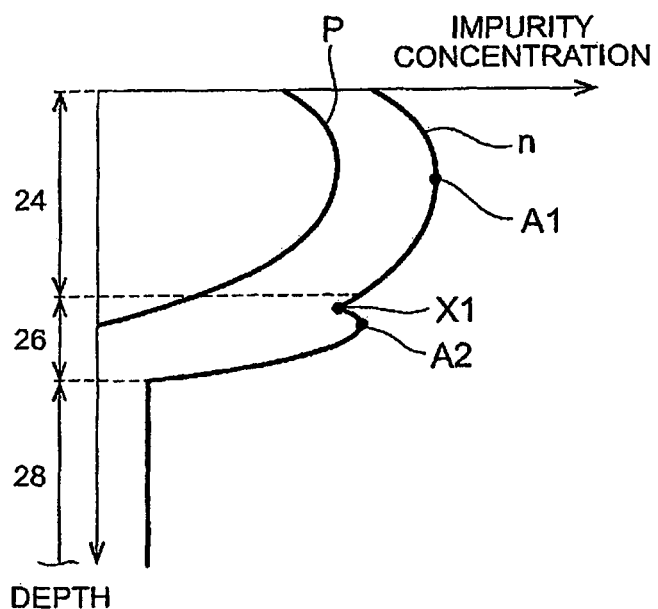
FIG. 4 is a graph that shows impurity concentration distributions corresponding to FIG. 2 in the semiconductor device of Embodiment 2 of the present invention.

Across-sectional structure of a semiconductor device of Embodiment 2 is the same as that of the semiconductor device 10 of Embodiment 1 shown in FIG. 1. In the semiconductor device of Embodiment 2, when viewed along a II-II line of FIG. 1, the impurities are distributed as shown in FIG. 4. In the semiconductor device of Embodiment 2, in the same manner as the semiconductor device 10 of Embodiment 1, the n-type impurity concentration has the maximum value A1. Further, on the lower side of the folding point X1 that is formed on the lower side of the maximum value A1, the n-type impurity concentration changes to an increase. That is, at the folding point X1, the n-type impurity concentration has a minimum value. Further, on the lower side of the folding point X1, a maximum value A2 of the n-type impurity concentration is formed. The maximum value A2 is present within the barrier region 26. On the lower side of the maximum value A2, the n-type impurity concentration decreases to a concentration in the drift region 28. Further, a p-type impurity concentration distribution of FIG. 4 is substantially the same as the p-type impurity concentration distribution of FIG. 2.

Figure 5:
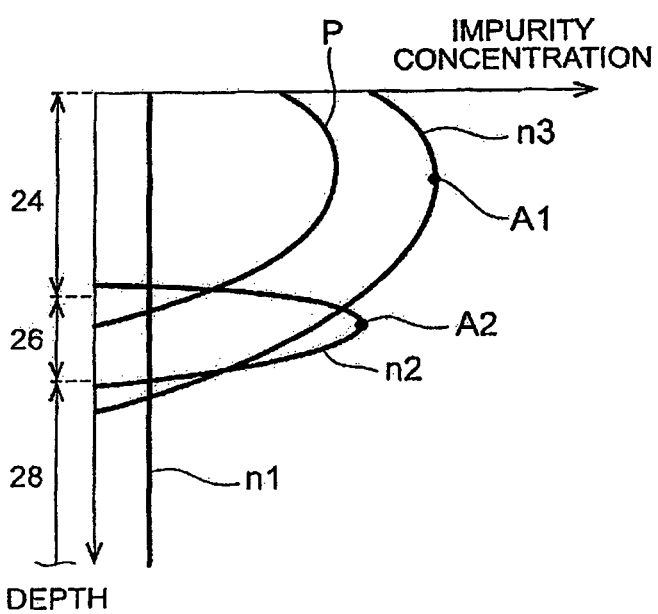
FIG. 5 is a graph that shows impurity concentration distributions corresponding to FIG. 3 in the semiconductor device of Embodiment 2 of the present invention.

According to the method of manufacturing the semiconductor device of Embodiment 2, the step of forming the low concentration body region 22b and the step of forming the pillar region 24 are performed in substantially the same manner as Embodiment 1. Therefore, distributions shown in graphs n1, n3 and p of FIG. 5 are obtained. According to the method of manufacturing of Embodiment 2, the step of forming the barrier region 26 is performed such that the average stop position of the n-type impurity becomes a depth corresponding to the barrier region 26. Thereafter, the step of diffusing the implanted n-type impurity is performed such that the diffusion distance becomes relatively short. Therefore, the implanted n-type impurity is distributed as shown in the graph n2 of FIG. 5. That is, in the barrier region 26, the maximum value A2 is formed. In the method, as shown in. FIG. 5, in a region having a relatively low n-type impurity concentration in the graph n3 (that is, a side deeper than the maximum value A1), the barrier region 26 is formed. Therefore, the barrier region 26 can be formed by implanting the n-type impurity of relatively low concentration. Thus, the n-type impurity concentration in the barrier region 26 can be reduced. Therefore, the semiconductor device of Embodiment 2 is unlikely to cause the latch-up.

Figure 6:
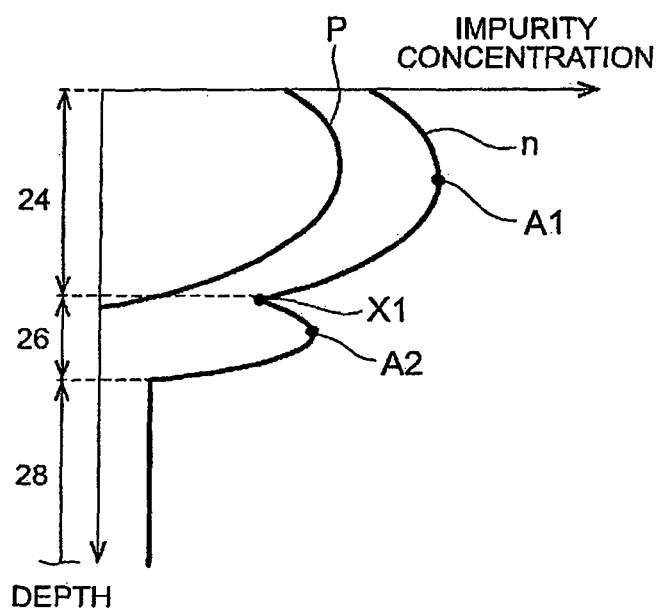
FIG. 6 is a graph that shows impurity concentration distributions corresponding to FIG. 2 in a semiconductor device of Embodiment 3 of the present invention.

A cross-sectional structure of a semiconductor device of Embodiment 3 is the same as that of the semiconductor device 10 of Embodiment 1 shown in FIG. 1. In the semiconductor device of Embodiment 3, when viewed along a II-II line of FIG. 1, the impurity is distributed as shown in FIG. 6. In the semiconductor device of Embodiment 3, in the same manner as the semiconductor device 10 of Embodiment 2, the n-type impurity concentration has the maximum values A1 and A2 and the folding point X1.

Figure 7:
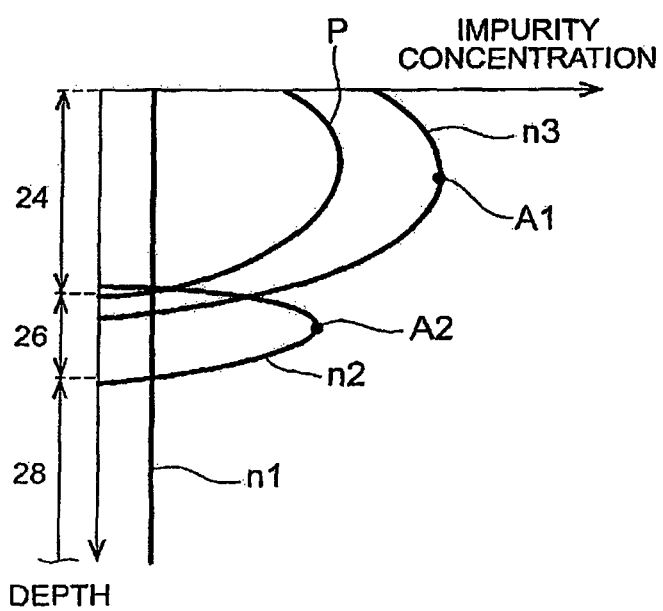
FIG. 7 is a graph that shows impurity concentration distributions corresponding to FIG. 3 in the semiconductor, device of Embodiment 3 of the present invention.

According to the method of manufacturing the semiconductor device of Embodiment 3, the step of forming the low concentration body region 22b and the step of forming the pillar region 24 are performed in substantially the same manner as those of Embodiment 1. Therefore, distributions shown in the graphs n1, n3 and p of FIG. 7 are obtained. According to the method of manufacturing of Embodiment 2, the step of forming the barrier region 26 is performed such that the average stop position of the n-type impurity becomes a depth corresponding to the barrier region 26. Further, the n-type impurity is implanted such that the average stop position becomes a depth in which the n-type impurity that is implanted by the impurity implantation in the pillar region 24 is not distributed. Therefore, as shown in FIG. 7, the maximum value A2 is formed at a depth in which a value of the graph n3 is substantially zero. Thus, by forming the barrier region 26 at a depth in which the value of the graph n3 is substantially zero, the n-type impurity concentration in the barrier region 26 can be more reduced. Therefore, the semiconductor device of Embodiment 3 is unlikely to cause the latch-up.

Figure 8:
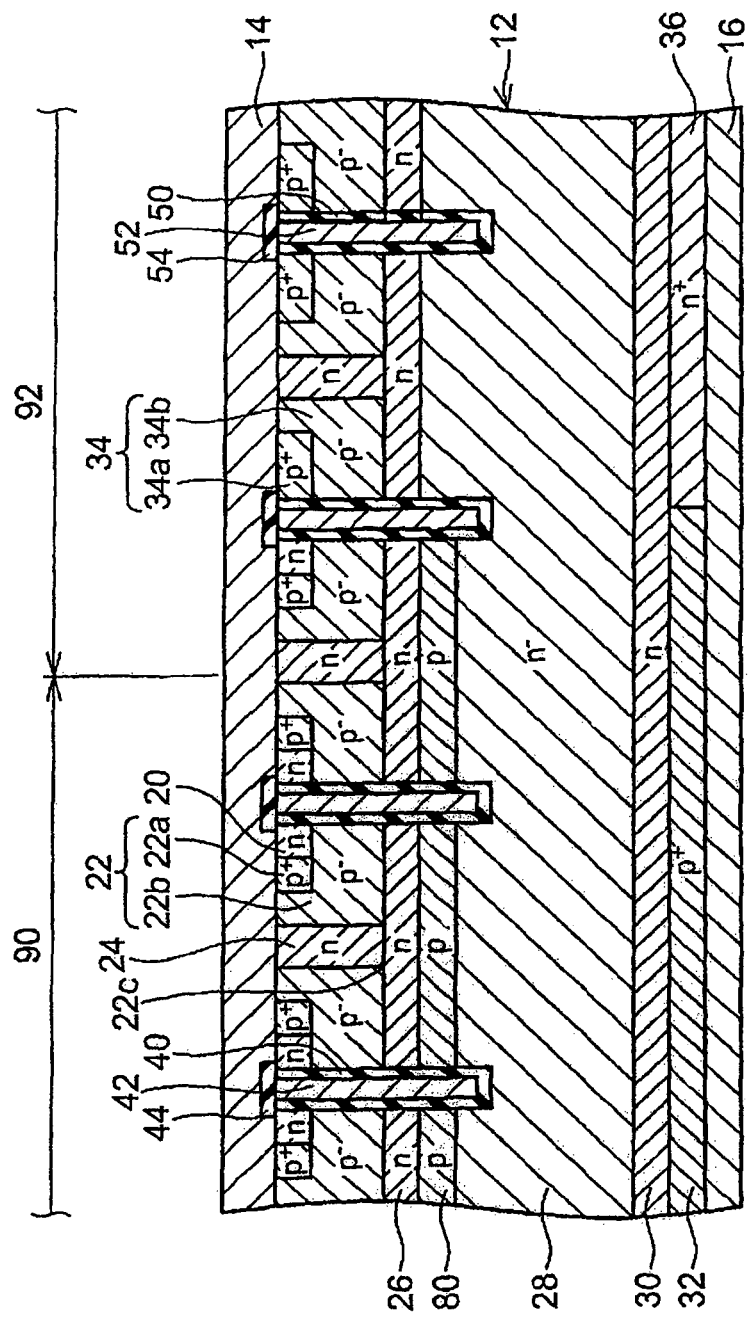
FIG. 8 is a vertical cross-sectional view of a semiconductor device of Embodiment 4 of the present invention.

In a semiconductor device of Embodiment 4, as shown in FIG. 8, a lower body region 80 is formed between the bather region 26 and the drift region 28. Other structures of the semiconductor device of Embodiment 4 are the same as those of the semiconductor device of Embodiment 1.

In the semiconductor device of Embodiment 1, when the IGBT is being turned off, the barrier region 26 and the drift region 28 are depleted, and a voltage is held by the depleted regions. Since a corner part 22c of the body region 22 (a corner part that faces the pillar region 24 and the barrier region 26: see FIG. 1) faces the depleted regions like this, an electric field is likely to be concentrated at the corner part 22c.

On the other hand, in the semiconductor device of Embodiment 4, a depletion layer expands mainly from the lower body region 80 into the drift region 28. Therefore, a voltage is applied mainly to, the drift region 28. Therefore, it is neither likely that a high voltage is generated in the proximity of the corner part 22c of the body region 22 nor likely that the electric field is concentrated at the corner part 22c. Therefore, the semiconductor device of Embodiment 4 has high avalanche resistance.

Further, when the lower body region 80 is formed by implantation and diffusion of the impurity, a part of a p-type impurity that is implanted in the lower body region 80 is distributed also to the barrier region 26. Since the p-type impurity becomes a counterpart of the n-type impurity in the barrier region 26, an essential n-type impurity concentration in the barrier region 26 becomes low. Therefore, the depletion layer becomes more difficult to be expanded into the body region 22. Therefore, the semiconductor device of Embodiment 4 is more unlikely to cause the latch-up.

In each of the Embodiments described above, in the step of implanting the p-type impurity in the low concentration body region 22b, the p-type impurity was implanted- also in the pillar region 24. However, in the relevant step, a surface corresponding to the pillar region 24 may be masked so as not to implant the p-type impurity in the pillar region 24. According to such a structure, an implantation concentration of the n-type impurity in the step of forming the pillar region 24 can be reduced. As a result, also the implantation concentration of the n-type impurity in the step of forming the barrier region 26 can be reduced. Therefore, the semiconductor device can be more unlikely, to cause the latch-up. In this case, an average value of the p-type impurity concentration in the pillar region 24 can be set to less than $1\times10^{15}$ atoms/cm$^1$.

Further, in each of the Embodiments described above, although the anode region 34 was formed in the diode region 92, the anode region 34 is not necessarily needed. For example, on an entire top surface side of the semiconductor substrate 12, a structure of a top surface side of the IGBT region 90 of FIG. 1 may be formed. The body region 22 in the IGBT region 90 can operate in substantially the same manner as the anode region 34. Further, as described above, the pillar region 24 in the IGBT region 90 operates in substantially the same manner as the pillar region 24 in the diode region 92. In this case, the body region 22 combines a function as the anode region 34. Therefore, even in such a structure, in substantially the same manner as each of the Embodiments described above, the semiconductor device can be operated.

Further, in each of the Embodiments described above, although the buffer region 30 was formed, the buffer region 30 may not be formed. That is, the drift region 28 may come into direct contact with the collector. region 32.

Further, in each of the Embodiments described above, although the folding point X1 is located in the bather region 26, the folding point X1 may be located in the pillar region 24.

While specific Embodiments of the present invention have been described in detail, these are only illustrations and do not limit the present invention. Various changes and modifications of the specific Embodiments exemplified in the above) are included in the present invention. Technical elements described in the present specification or drawings exert technical usefulness singularly or in various combinations thereof.

What is claimed is:

1. A semiconductor device comprising:
   a semiconductor substrate;
   an upper electrode formed on a top surface of the semiconductor substrate;
   a lower electrode formed on a bottom surface of the semiconductor substrate; and
   a gate electrode, wherein
   an emitter region, a body region, a pillar region, a barrier region, a drift region, a collector region and a cathode region are formed in the semiconductor substrate,
   the emitter region has an n-type impurity and is connected to the upper electrode,
   the body region has a p-type impurity, is formed on a lateral side and on a lower side of the emitter region, and is connected to the upper electrode,
   the pillar region has an n-type impurity, is formed on a lateral side of the body region, extends along a depth from the top surface of the semiconductor substrate to a lower end of the body region, is connected to the upper electrode, and is separated from the emitter region by the body region,
   the barrier region has an n-type impurity, is formed on a lower side of the body region and the pillar region, and is separated from the emitter region by the body region,
   the drift region has an n-type impurity, is formed on a lower side of the barrier region, is separated from the emitter region by the barrier region, and has an n-type impurity concentration lower than an n-type impurity concentration in the pillar region and the barrier region,
   the collector region has a p-type impurity, is formed on a lower side of the drift region, is connected to the lower electrode, and is separated from the barrier region by the drift region,
   the cathode region has an n-type impurity, is formed on the lower side of the drift region, is connected to the lower electrode, is separated from the barrier region by the drift region, and has an n-type impurity concentration higher than the n-type impurity concentration in the drift region,
   a trench that penetrates through the emitter region, the body region and the barrier region and reaches the drift region is formed on the top surface of the semiconductor substrate,
   an inner surface of the trench is covered with a gate insulating film,
   the gate electrode is disposed in the trench,
   an n-type impurity concentration distribution in a depth direction in the pillar region and the barrier region is arranged in a curved line which has a peak in the depth direction and has a maximum value in the pillar region, and
   the n-type impurity concentration distribution has a folding point on a side deeper than the maximum value in the pillar region and shallower than a border of the barrier region and the drift region in the depth direction.

2. The semiconductor device according to claim 1, wherein the n-type impurity concentration distribution has a maximum value in the barrier region.

3. The semiconductor device according to claim 1, wherein
   a p-type lower body region is formed between the barrier region and the drift region, and
   the lower body region separates the barrier region and the drift region, is separated from the body region by the barrier region, and is separated from the collector region and the cathode region by the drift region.

4. The semiconductor device according to claim 1, wherein an average value of a p-type impurity concentration in the pillar region is less than $1\times10^{15}$ atoms/cm$^3$.

* * * * *